(12) United States Patent
Kanzaki et al.

(10) Patent No.: US 11,650,469 B2
(45) Date of Patent: May 16, 2023

(54) METHOD FOR PRODUCING DISPLAY DEVICE

(71) Applicant: SHARP KABUSHIKI KAISHA, Sakai (JP)

(72) Inventors: Yohsuke Kanzaki, Sakai (JP); Takao Saitoh, Sakai (JP); Masahiko Miwa, Sakai (JP); Masaki Yamanaka, Sakai (JP); Yi Sun, Sakai (JP); Seiji Kaneko, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 458 days.

(21) Appl. No.: 17/040,407

(22) PCT Filed: Mar. 28, 2018

(86) PCT No.: PCT/JP2018/013022
§ 371 (c)(1),
(2) Date: Sep. 22, 2020

(87) PCT Pub. No.: WO2019/186842
PCT Pub. Date: Oct. 3, 2019

(65) Prior Publication Data
US 2021/0063794 A1    Mar. 4, 2021

(51) Int. Cl.
*G02F 1/1368* (2006.01)
*H01L 27/088* (2006.01)
*G09G 3/3233* (2016.01)

(52) U.S. Cl.
CPC ......... *G02F 1/1368* (2013.01); *G09G 3/3233* (2013.01); *H01L 27/088* (2013.01); *H10K 59/1213* (2023.02); *G09G 2300/0876* (2013.01)

(58) Field of Classification Search
CPC .............. G02F 1/1368; H10K 59/1213; G09G 3/3233; H01L 27/088; G29G 9300/0876
USPC .................................. 257/59; 438/109, 151
See application file for complete search history.

(56) References Cited

U.S. PATENT DOCUMENTS

2017/0047038 A1*  2/2017  Noma et al. ......... G09G 3/3696

FOREIGN PATENT DOCUMENTS

| JP | H05-100236 A | 4/1993 |
| JP | 2014-033136 A | 2/2014 |

\* cited by examiner

*Primary Examiner* — Thinh T Nguyen
(74) *Attorney, Agent, or Firm* — ScienBiziP, P.C.

(57) ABSTRACT

A method for manufacturing a display device includes a pixel circuit formed on a substrate, wherein a manufacturing process of the pixel circuit includes a patterning step of a metal film performed in the following procedures (a) to (e): (a) forming the metal film on the substrate; (b) forming a first resist pattern on the metal film by a photolithographic method; (c) etching the metal film with the first resist pattern to form a first metal pattern; (d) forming by the photolithographic method on the metal film formed in the first metal pattern, a second resist pattern including a pattern shape smaller than a pattern shape of the first resist pattern; and (e) etching the metal film with the second resist pattern to form a second metal pattern.

4 Claims, 4 Drawing Sheets

METHOD FOR PRODUCING DISPLAY DEVICE

TECHNICAL FIELD

The disclosure relates to a method for manufacturing a display device such as an organic electroluminescence (EL) display device.

BACKGROUND ART

In recent years, organic EL display devices including organic light emitting diodes (OLEDs) in pixels have been actively developed. An organic EL display device includes a basic structure in which a light-emitting layer made of an organic material is sandwiched between two substrates (such as a plastic film), and a pixel circuit for supplying a current to pixels in the light-emitting layer is formed on one of the substrates. The pixel circuit is typically manufactured to include a patterning step of forming a metal film on the substrate and patterning the metal film. Patterning of the metal film is performed by etching in which a resist film formed on the metal film is exposed and developed by photolithography (photolithography step) and the developed resist film is applied as an etching mask.

In the patterning step of the metal film, when foreign matters are present on the etching mask during etching, etching residue may be generated, resulting in a leak defect caused by a short-circuit of wire or the like. In a case where such etching residue is generated, for example, in a manufacturing process of a liquid crystal display device, a rework process for re-forming an etching mask and re-etching is known (PTL 1). In other words, portions of etching residue can be removed by the rework process.

CITATION LIST

Patent Literature

PTL 1: JP H05-100236 A

SUMMARY

Technical Problem

The organic EL display device has a very large pattern density in the pixel circuit compared with a liquid crystal display device. Therefore, when any etching residue is generated by foreign matters in the patterning step, the yield of panels will be significantly reduced. In other words, the organic EL display device has a small interval between wiring lines in a wiring line pattern compared with the liquid crystal display device, and thus, even foreign matters having a size unlikely to lead to leak defects in the liquid crystal display device are likely to cause lead defects in the organic EL display device.

In addition, even in a case where a rework process for re-forming an etching mask and re-etching is performed when etching residue is generated in the organic EL display device, the organic EL display device where a pattern density is large (the wiring lines are densely arranged) may have the following problems.

FIG. 4(a) illustrates a state after a first photolithography step, i.e., a state where a resist pattern 110 that becomes an etching mask is formed on a metal film 100. In the state illustrated in FIG. 4(a), a foreign matter 120 is present on the etching mask. FIG. 4(b) illustrates a state after a first etching step (after resist peeling), i.e., a state where the metal film 100 is patterned. Note that in the state illustrated in FIG. 4(b), an etching residue is generated with the metal film 100 not etched in a location where the foreign matter 120 is present. Such an etching residue causes pattern collapse.

FIGS. 4(c) and (d) illustrate a known rework process for removing such an etching residue. FIG. 4(c) illustrates a state after a second photolithography step, i.e., a state where a second resist pattern 111 is formed on the metal film 100 for rework. Although not sufficiently illustrated in FIG. 4(c), at this time, the second resist pattern 111 is formed in the same pattern as the first resist pattern 110 such that the line width is slightly larger (larger by approximately 1.5 µm). This is because when the second resist pattern 111 has the same line width as the first resist pattern, the line width of the wiring lines ultimately formed is too small compared with design dimensions due to the misalignment of the etching mask or the like.

FIG. 4(d) illustrates a state after a second etching step (after resist peeling), i.e., a state where the metal film 100 is ultimately patterned. In the state illustrated in FIG. 4(d), a short-circuit between the wiring lines due to etching residue is eliminated; however, the wiring width of the second resist pattern 111 is increased. Therefore, the wiring line in a location where the etching residue is present is thicker than the wiring lines in other locations, and the pattern collapse is not completely eliminated.

As just described, in the location where the wiring line is thick, the interval between the adjacent wiring lines are small, which leads to an increase of the parasitic capacitance between the wiring lines. In a liquid crystal display device having a small pattern density, the influence of such an increase of the parasitic capacitance is small; meanwhile, in an organic EL, display device having a large pattern density, the influence of increase of the parasitic capacitance is large, which leads to poor display such as display unevenness.

The disclosure is made in view of the foregoing problems, and an object of the disclosure is to provide a method for manufacturing a display device, which can improve the yield by including a rework process for forming an etching mask and etching multiple times.

Solution to Problem

In order to solve the foregoing problems, the disclosure is a method for manufacturing a display device including a pixel circuit formed on a substrate, and a manufacturing process of the pixel circuit includes a patterning step of a metal film, which is performed in the following procedures (a) to (e).

(a) Forming the metal film on the substrate.

(b) Forming a first resist pattern on the metal film by a photolithographic method.

(c) Etching the metal film with the first resist pattern to form a first metal pattern.

(d) Forming by the photolithographic method on the metal film formed in the first metal pattern, a second resist pattern including a pattern shape smaller than a pattern shape of the first resist pattern.

(e) Etching the metal film with the second resist pattern to form a second metal pattern.

According to the configuration above, the second resist pattern includes the pattern shape smaller than the pattern shape of the first resist pattern. Thus, a rework process with the second resist pattern does not cause the line width of wiring lines in a rework location to be increased as in a known rework process (no pattern collapse), and the parasitic capacitance between the wiring lines does not change. Consequently, poor display such as display unevenness can be prevented. In other words, the pattern collapse generated by the first etching can be reworked at the second etching while poor display such as display unevenness is prevented, and the yield of the display device can be improved.

In the foregoing method for manufacturing the display device, the first resist pattern and the second resist pattern may include different patterns, and the first resist pattern may include the pattern shape simpler than the second resist pattern and divide at least bus lines traversing from one end to the other end of a display region.

According to the configuration described above, the metal film is patterned by etching with the first resist pattern to separate the bus line. Therefore, at least a short-circuit between the bus lines can be prevented, and significant defects such as line defects can be prevented. In addition, the regular wiring line pattern is finished by etching with the second resist pattern. Therefore, the pattern collapse generated by the first etching can be reworked while poor display such as display unevenness is prevented, and the yield of the display device can be improved.

Further, in the foregoing method for manufacturing the display device, the first resist pattern and the second resist pattern may include the same pattern, and the first resist pattern may be formed to include a line width larger in a wiring line pattern than the second resist pattern.

According to the configuration described above, at least a short-circuit between the bus lines can be prevented by etching with the first resist pattern having the large line width, and significant defects such as line defects can be prevented. In addition, the regular wiring line pattern is finished by etching with the second resist pattern. Therefore, the pattern collapse generated by the first etching can be reworked while poor display such as display unevenness is prevented, and the yield of the display device can be improved.

Furthermore, in the foregoing method for manufacturing the display device, the patterning step may be applied to forming of a layer including a scanning signal line in the display device.

Moreover, in the foregoing method for manufacturing the display device described above, the patterning step may be applied to forming of a layer including a source signal line in the display device.

In addition, in the foregoing method for manufacturing the display device, in the step (b) and the step (d), the first resist pattern and the second resist pattern may be formed by using the same photomask, and the exposure amount in step (b) may be less than the exposure amount in step (d).

According to the configuration described above, manufacturing costs can be reduced by using the common photomask in the step (b) and the step (d).

Further, in the foregoing method for manufacturing the display device, the pixel circuit of the display device may include a TFT of a top-gate type semiconductor layer as a switching element, the patterning step may be applied to forming of a metal layer including at least a gate electrode in the display device. A first gate electrode may be formed in the step (c), and high concentration impurity doping may be performed on a semiconductor layer by using the first gate electrode as a doping mask between the step (c) and the step (d). A second gate electrode having a length smaller in a channel direction than that of the first gate electrode may be formed in the step (e), and low concentration impurity doping may be performed on the semiconductor layer by using the second gate electrode as a doping mask after the step (e).

According to the configuration described above, in addition to that the pattern collapse generated by the first etching can be reworked by the second etching, the first gate electrode included in the first metal pattern and the second gate electrode included in the second metal pattern can also be used as doping masks in the impurity doping step for the TFT. Consequently, the manufacturing process can be simplified.

Furthermore, in the foregoing method for manufacturing the display device, the high concentration impurity doping may be performed by $p^+$ doping, and the low concentration impurity doping may be performed by $p^-$ doping.

In addition, in the foregoing method for manufacturing the display device, a source region and a drain region may be formed in the semiconductor layer by the high concentration impurity doping, and an LDD region may be formed in the semiconductor layer by the low concentration impurity doping.

According to the configuration described above, the first gate electrode and the second gate electrode may be used as doping masks for the TFT LDD formation process.

Advantageous Effects of Disclosure

The method for manufacturing the display device of the disclosure achieves the effect that the pattern collapse generated by the first etching can be reworked by the second etching while poor display such as display unevenness is prevented, and the yield of the display device can be improved.

DESCRIPTION OF EMBODIMENTS

First Embodiment

Hereinafter, embodiments of the disclosure will be described in detail with reference to the drawings. FIGS. 1(a) to (d) illustrate a method for manufacturing a display device according to the first embodiment, and are plan views illustrating procedures for a patterning step of patterning a metal film in a manufacturing process of a pixel circuit formed on a substrate of a display device.

Figure 1:
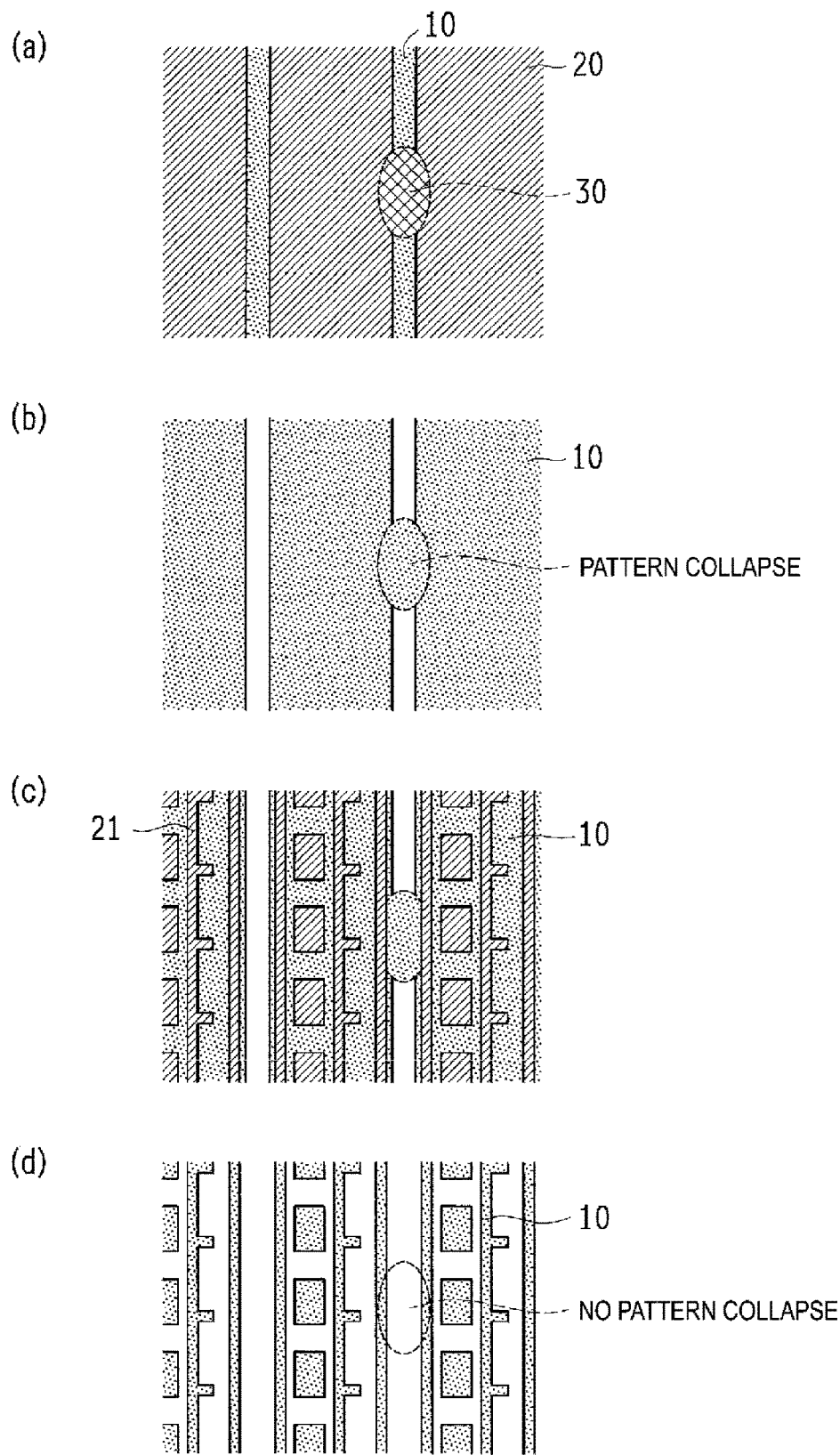
FIGS. 1(a) to (d) illustrate a method for manufacturing a display device according to a first embodiment of the disclosure, and are plan views illustrating procedures for a patterning step of patterning a metal film in a manufacturing process of a pixel circuit formed on a substrate of a display device.

FIG. 1(a) illustrates a state after a first photolithography step, i.e., a state where a first resist pattern 20 (patterned resist film) is formed on a metal film 10 formed as a full solid film. In the state illustrated in FIG. 1(a), a foreign matter 30 is present on an etching mask. FIG. 1(b) illustrates a state after a first etching step (after resist peeling), i.e., a state where the metal film 10 is patterned into a first metal pattern, Note that the foreign matter 30 present in the state of FIG. 1(a) is typically removed at the same time as resist peeling. However, the foreign matter 30 remains in the etching stage; therefore, etching residue is generated with the metal film 10 not etched in a location where the foreign matter 30 is present. Such etching residue causes pattern collapse.

In the patterning step according to the first embodiment, the first resist pattern 20 formed first does not coincide with a final wiring line pattern and serves as a rough etching mask that only divides the metal film 10 into large blocks. More specifically, the first resist pattern 20 has a simple pattern shape that does not coincide with the final wiring line pattern; however, at least bus lines in the pixel circuit are divided. Here, the "bus line" is referred to as a wiring line that traverses from one end to the other end of a display region of the display device.

The first resist pattern 20 may be designed such that the metal film 10 remains as a solid film without being patterned on a wiring line having a line width of 1.5 μm or less. This is because the resolution limit of a projection exposure device (such as an stepper) used to form the etching masks (the first resist pattern 20 and a second resist pattern 21 described below) is approximately 1.5 μm.

Note that in the manufacturing process of the pixel circuit, the patterning step of the metal film 10 as just described is performed multiple times rather than once. The method described in the present embodiment can be applied to various patterning steps. For example, in a patterning step of a gate layer (a metal layer including a scanning signal line), the scanning signal line, a light emission control line, an initialization power source line, and others correspond to bus lines, and the first resist pattern 20 may be formed as blocks that divide the bus lines. In addition, in a patterning step of a source layer (a metal layer including a source signal line), the source signal line, a high power supply voltage line (ELVDD), and others correspond to bus lines, and the first resist pattern 20 may be formed as blocks that divide the bus lines. In addition, the disclosure can also be applied to a patterning step for forming a high power supply voltage line serving as a capacitance wiring line.

FIG. 1(c) illustrates a state after a second photolithography step, i.e., a state where the new second resist pattern 21 (patterned resist film) is formed on the metal film 10. The second resist pattern 21 formed for the second time coincides with the final wiring line pattern, and is formed on the metal film 10 in the state illustrated in FIG. 1(b), that is, the metal film 10 formed in the first metal pattern.

FIG. 1(d) illustrates a state after a second etching step (after resist peeling), i.e., a state of the metal film 10 formed in a second metal pattern (that is, a metal wiring line pattern formed in the pixel circuit). In the state illustrated in FIG. 1(d), the pattern collapse generated in the state illustrated in FIG. 1(b) is eliminated at the same time as the final metal wiring line pattern is formed by etching with the second resist pattern 21. In other words, etching with the second resist pattern 21 serves as a rework process to rework the pattern collapse generated at the time of etching with the first resist pattern 20.

In the patterning step in the first embodiment, the pattern shape of the second resist pattern 21 is smaller than that of the first resist pattern 20. In other words, the second resist pattern 21 completely overlaps the metal film 10 thereon etched by the first resist pattern 20 and does not extend out of the metal film 10. Note that in a location where the edge of the second resist pattern 21 is located close to the edge of the metal film 10 etched by the first resist pattern 20, a margin of approximately 1 μm is preferably provided in consideration of alignment accuracy.

The pattern shape of the second resist pattern 21 is smaller than that of the first resist pattern 20 as just described. Accordingly, the rework process with the second resist pattern 21 does not cause the line width of wiring lines in a rework location to be increased as in a known rework process (no pattern collapse), and the parasitic capacitance between the wiring lines does not change. Consequently, poor display such as display unevenness can be prevented.

In the patterning step according to the first embodiment, the metal film 10 is patterned to separate the bus lines by etching with the first resist pattern 20, and thus at least a short-circuit between the bus lines can be prevented, and significant defects such as line defects can be prevented. In addition, the regular wiring line pattern is finished by etching with the second resist pattern 21. Therefore, the pattern collapse generated by the first etching can be reworked while poor display such as display unevenness is prevented, and the yield of the display device can be improved.

Further, in the patterning step according to the first embodiment, since the first resist pattern 20 is a rough etching mask, a wet etching process having a large shift amount can be applied to etching with the first resist pattern 20. When the wet etching process is applied, defects caused by etching dust generated in a dry etching process can be reduced.

Second Embodiment

FIGS. 2(a) to (d) illustrate a method for manufacturing a display device according to the second embodiment, and are plan views illustrating procedures for a patterning step of patterning a metal film in a manufacturing process of a pixel circuit formed on a substrate of a display device.

Figure 2:
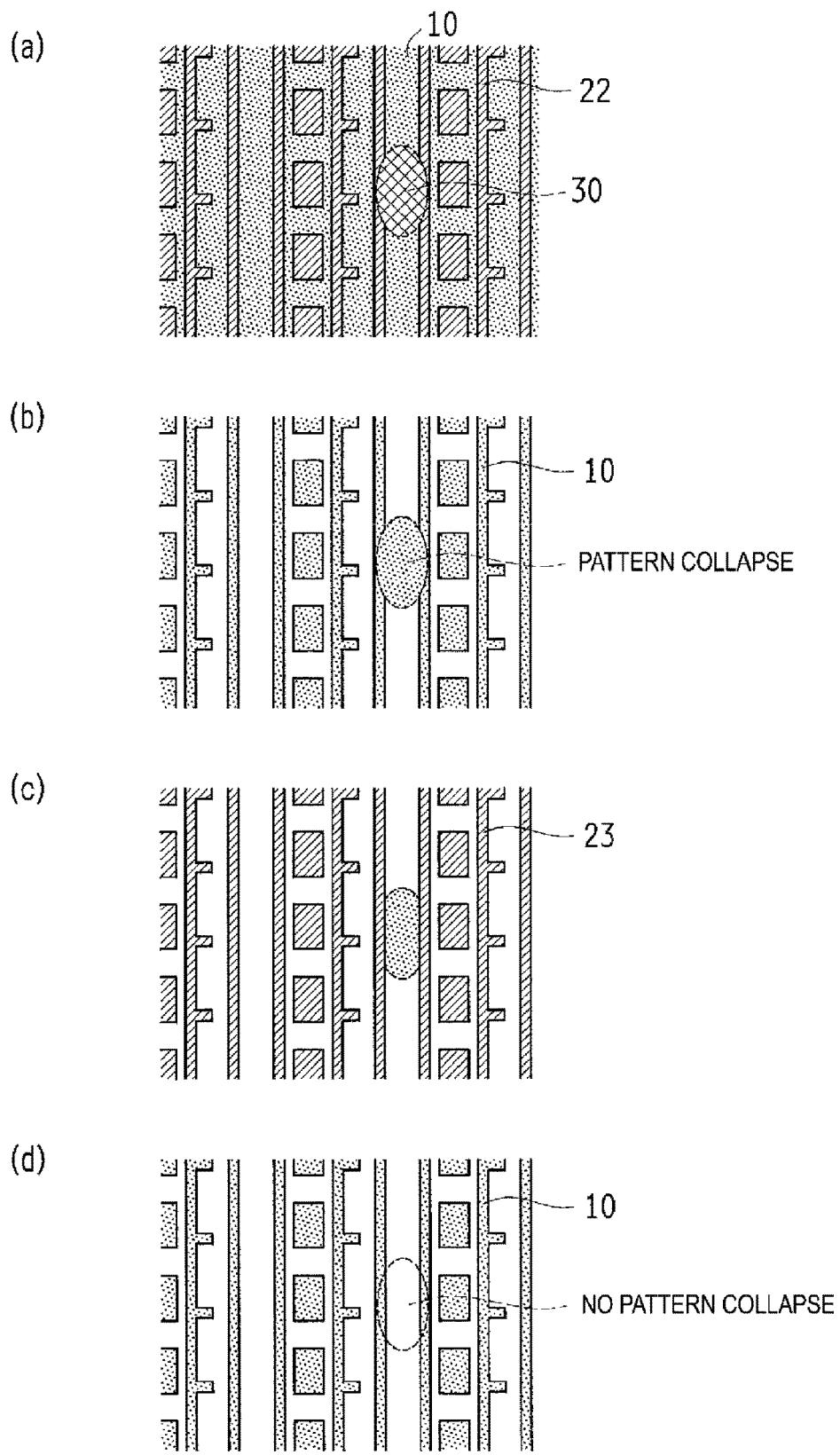
FIGS. 2(a) to (d) illustrate a method for manufacturing a display device according to a second embodiment of the disclosure, and are plan views illustrating procedures for a patterning process of patterning a metal film in a manufacturing process of a pixel circuit formed on a substrate of a display device.

FIG. 2(a) illustrates a state after a first photolithography step, i.e., a state where a first resist pattern 22 (patterned resist film) is formed on the metal film 10. In the state illustrated in FIG. 2(a), the foreign matter 30 is present on an etching mask. FIG. 2(b) illustrates a state after a first etching step (after resist peeling), i.e., a state where the metal film 10 is patterned into a first metal pattern. Note that in the state illustrated in FIG. 2(a), etching residue is generated with the metal film 10 not etched in a location where the foreign matter 30 is present. Such etching residue causes pattern collapse.

In the patterning step according to the second embodiment, the first resist pattern 22 formed first coincides with an actual wiring line pattern, but is formed thicker than a second resist pattern 23 described below. Specifically, the first resist pattern 22 is preferably thicker by approximately 1.5 μm than the second resist pattern 23. This is also because the resolution limit of a projection exposure device (such as an i-line stepper) used to form the etching masks (the first resist pattern 22 and the second resist pattern 23) is approximately 1.5 μm.

FIG. 2(c) illustrates a state after a second photolithography step, i.e., a state where the new second resist pattern 23 (patterned resist film) is formed on the metal film 10. The second resist pattern 23 formed for the second time coincides with a final wiring line pattern, and is formed on the metal film 10 in the state illustrated in FIG. 1(b), Note that, although not sufficiently illustrated in FIG. 2(c), the second resist pattern 23 is formed in the same pattern as the first resist pattern 22 such that the line width is slightly smaller (smaller by approximately 1.5 μm).

Note that in the second embodiment, the first resist pattern 22 and the second resist pattern 23 coincide with the same wiring line pattern; however, the line widths differ from each other. Therefore, in the photolithography step of the first resist pattern 22 and the photolithography step of the second resist pattern 23, different photomasks are preferably used. However, the disclosure is not limited thereto. Alternatively, the same photomask may be used in the photolithography step of the first resist pattern 22 and the photolithography step of the second resist pattern 23, and the exposure amounts thereof may differ from each other. In this case, the exposure amount in the photolithography step of the second resist pattern 23 may be increased. As just described, the common photomask is used in the photolithography step of the first resist pattern 22 and the photolithography step of the second resist pattern 23, and thus manufacturing costs can be reduced.

FIG. 2(d) illustrates a state after a second etching step (after resist peeling), i.e., a state of the metal film 10 formed in a second metal pattern (that is, a metal wiring line pattern formed in the pixel circuit). In the state illustrated in FIG. 2(d), the pattern collapse generated in the state illustrated in FIG. 2(b) is eliminated at the same time as the final metal wiring line pattern is formed by etching with the second resist pattern 23. In other words, etching with the second resist pattern 23 serves as a rework process to rework the pattern collapse generated at the time of etching with the first resist pattern 22.

In the patterning step of the second embodiment, the pattern shape of the second resist pattern 23 is smaller than that of the first resist pattern 22. The pattern shape of the second resist pattern 23 is smaller than that of the first resist pattern 22 as just described. Accordingly, the rework process with the second resist pattern 23 does not cause the line width of wiring lines in a rework location to be increased as in a known rework process, and the parasitic capacitance between the wiring lines does not change. Consequently, poor display such as display unevenness can be prevented.

Likewise, in the patterning step according to the second embodiment, at least a short-circuit between bus lines can be prevented by first etching with the first resist pattern 22 having a large line width, and significant defects such as line defects can be prevented. In addition, the regular wiring line pattern is finished by etching with the second resist pattern 23. Therefore, the pattern collapse generated by the first etching can be reworked while poor display such as display unevenness is prevented, and the yield of the display device can be improved.

Further, also in the patterning step according to the second embodiment, since the first resist pattern 22 is a rough etching mask having a large line width, a wet etching process having a large shift amount can be applied to etching with the first resist pattern 22.

Note that in the above descriptions of the first and second embodiments, a case where the metal film 10 is patterned by the two photolithography steps and the two etching steps. However, the disclosure is not limited thereto. Alternatively, the metal film 10 may be patterned by three or more photolithography steps and three or more etching steps.

Third Embodiment

Figure 3:
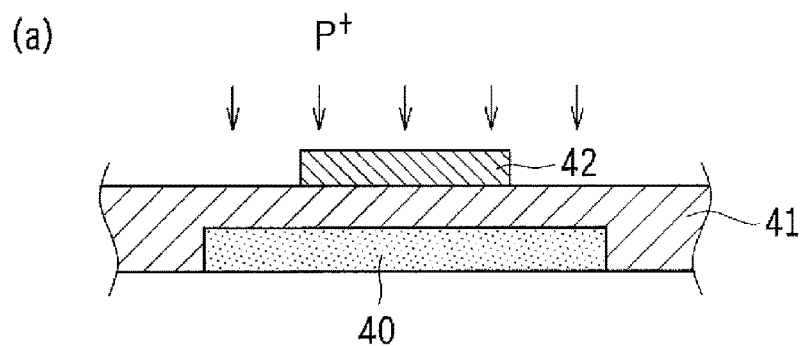
FIGS. 3(a) to (d) illustrate a method for manufacturing a display device according to a third embodiment of the disclosure, and are cross-sectional views illustrating procedures for doping impurities into a semiconductor layer of a TFT in a manufacturing process of a pixel circuit formed on a substrate of a display device.
Figure 3:
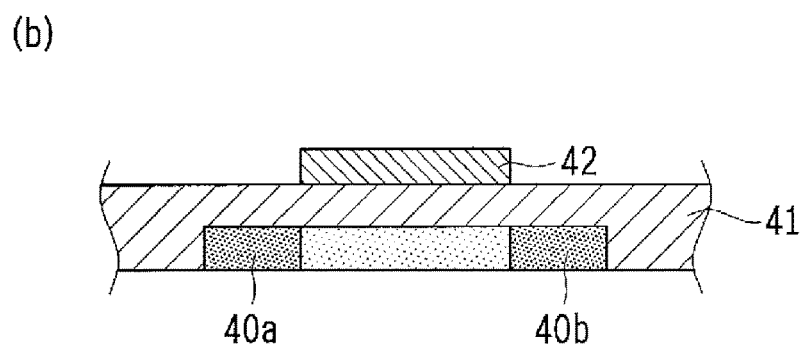
Figure 3:
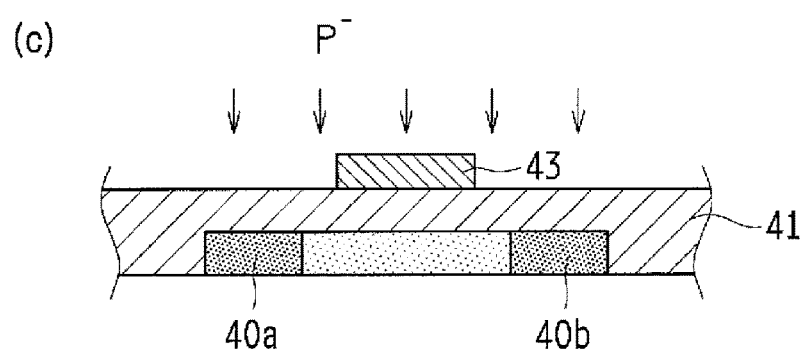
Figure 3:
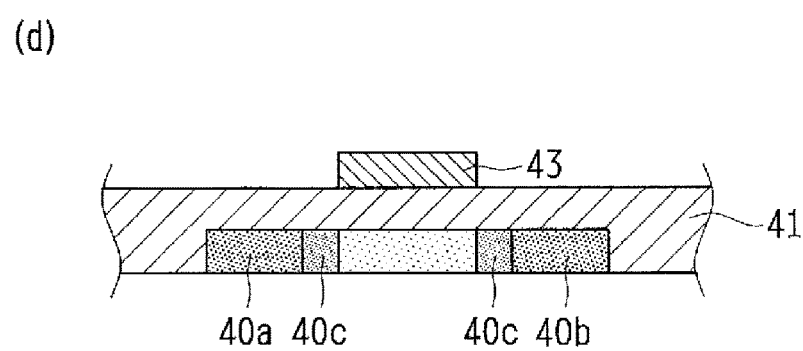
Figure 4:
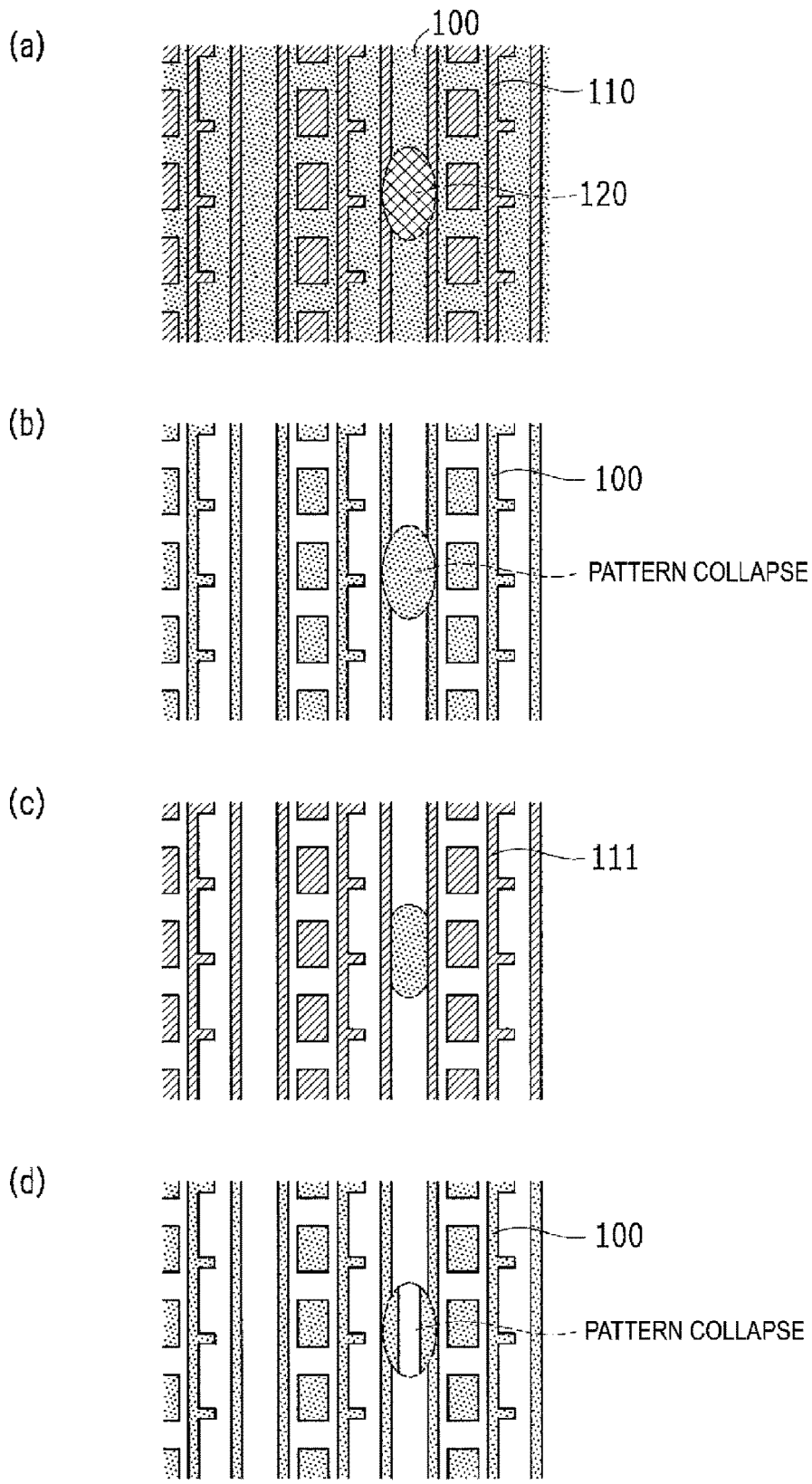
FIGS. 4(a) to (d) illustrate a method for manufacturing a known display device, and are plan views illustrating procedures for a patterning step of patterning a metal film in a manufacturing process of a pixel circuit formed on a substrate of a display device.

A method for manufacturing a display device according to the third embodiment is a modified example of the second embodiment, and is characterized in that two patterning steps with the first resist pattern 22 and the second resist pattern 23 are also used in a lightly doped drain (LDD) formation process. Note that the method described below can be applied in a patterning step for a gate layer in a case where the pixel circuit of the display device includes a top-gate type thin film transistor (TFT) as a switching element. The third embodiment will be described below with reference to FIG. 3.

In a case where the pixel circuit includes the top-gate type TFT, in a stage right before the patterning step for the gate layer is performed, as illustrated in FIG. 3(a), a semiconductor layer 40 (for example, a low-temperature polysilicon layer) serving as a channel portion of the TFT is formed, and a gate insulating film 41 is formed on the semiconductor layer 40. The low-temperature polysilicon film is formed and is thereafter patterned into a predetermined shape, and thus the semiconductor layer 40 is obtained. To form the TFT, a step of doping impurities (for example, phosphorus or boron) into the semiconductor layer 40 is required.

When the method described in the second embodiment is applied to the patterning step for the gate layer, the metal film 10 is formed on the gate insulating film 41, and the first resist pattern 22 is formed thereon. When the metal film 10 is etched with the first resist pattern 22, the metal film 10 is patterned into a predetermined wiring line pattern shape (first metal pattern).

The metal film 10 patterned at this time already includes a first gate electrode 42, and the first gate electrode 42 is located overlapping a center portion of the semiconductor layer 40 in a plan view. In addition, the first gate electrode 42 patterned by the first resist pattern 22 has a line width larger than a line width of a finally formed gate electrode (a second gate electrode 43 described below).

Then, in the method for manufacturing the display device according to the third embodiment, as illustrated in FIG. 3(b), after patterning the metal film 10 with the first resist pattern 22, i.e., before patterning the metal film 10 with the second resist pattern 23, $p^+$ doping (high concentration impurity doping) is performed on the semiconductor layer 40. At this time, the metal film 10 (specifically, the first gate electrode 42) patterned by the first resist pattern 22 is applied as a doping mask. The $p^+$ doping is performed to decrease the resistance of Si and to decrease the contact resistance of a source electrode and a drain electrode to Si, and this region becomes a source region 40a and a drain region 40b. Note that the doping may be performed after or before peeling the resist (i.e., the first resist pattern 22).

After the $p^+$ doping is performed, the second resist pattern 23 is further formed on the metal film 10 patterned first. When the metal film 10 is etched with the second resist pattern 23, the metal film 10 is patterned into a wiring line pattern (second metal pattern) having a wiring width of design dimensions. As illustrated in FIG. 3(c), the second metal pattern includes the second gate electrode 43.

After patterning the metal film 10 with the second resist pattern 23, p⁻ doping (low concentration impurity doping) is performed on the semiconductor layer 40 with the metal film 10 (specifically, the second gate electrode 43), which is patterned by the second resist pattern 23, applied as a doping mask. In other words, as illustrated in FIG. 43(d), LDD regions 40c are formed coinciding with portions different in size of the first gate electrode 42 from the second gate electrode 43 (the length of the first gate electrode 42 in the channel direction is greater than that of the second gate electrode 43). The p⁻ doping is performed to form the LDD regions and to mitigate the concentration of an electrical field on the drain end to suppress leakage current. The p⁻ doping may be performed after or before peeling the resist (i.e., the second resist pattern 23).

The metal film 10 patterned by the second resist pattern 23 has a line width smaller than that of the metal film 10 patterned by the first resist pattern 22; therefore, the p⁻ doping region can be formed inside the p⁺ doping region. Thus, in the method for manufacturing the display device according to the third embodiment, the pattern collapse generated by the first etching can be reworked by the second etching, and in addition, the metal film 10 (the first metal pattern and the second metal pattern) patterned by the first resist pattern 22 and the second resist pattern 23 can also be used as doping masks for the LDD formation process. Consequently, the manufacturing process can be simplified. Note that in the third embodiment, the high concentration impurity doping and the low concentration impurity doping are respectively illustrated as p⁺ doping and p⁻ doping, but the disclosure is not limited thereto. That is, the high concentration impurity doping and the low concentration impurity doping may be n⁺ doping and n⁻ doping. In addition, for example, phosphorus can be applied to p, and for example, boron can be applied to n.

Note that the display device described in the first to third embodiments is not particularly limited and may be any device including a display element. The aforementioned display element is a display element having luminance and transmittance that are controlled by an electric current, and examples of the display element controlled by an electric current include an organic EL display provided with an organic light emitting diode (OLED), an inorganic EL display provided with an inorganic light emitting diode, a quantum dot light emitting diode (QLED) display provided with a QLED, and others.

The embodiments disclosed herein are illustrative in all respects and are not a rationale for limited interpretation. Therefore, the technical scope of the disclosure is not to be construed only by the aforementioned embodiments, but is defined based on the description of the claims. In addition, all changes within the claims and within the meaning and range of equivalence are included.

REFERENCE SIGNS LIST

10 Metal film
20, 22 First resist pattern
21, 23 Second resist pattern
40 Semiconductor layer
40a Source region
40b Drain region
40c LDD region
41 Gate insulating film
42 First gate electrode
43 Second gate electrode

The invention claimed is:

1. A method for manufacturing a display device comprising a pixel circuit formed on a substrate,
 wherein a manufacturing process of the pixel circuit includes a patterning step of a metal film performed in the following procedures (a) to (e):
 (a) forming the metal film on the substrate;
 (b) forming a first resist pattern on the metal film by a photolithographic method;
 (c) etching the metal film with the first resist pattern to form a first metal pattern;
 (d) forming by the photolithographic method on the metal film formed in the first metal pattern, a second resist pattern including a pattern shape smaller than a pattern shape of the first resist pattern; and
 (e) etching the metal film with the second resist pattern to form a second metal pattern,
 the first resist pattern and the second resist pattern include different patterns from each other, and
 the first resist pattern includes the pattern shape simpler than the second resist pattern and divides at least bus lines traversing from one end to the other end of a display region.

2. The method for manufacturing the display device according to claim 1,
 wherein the patterning step is applied to forming of a metal layer including a scanning signal line in the display device.

3. A method for manufacturing a display device comprising a pixel circuit formed on a substrate,
 wherein a manufacturing process of the pixel circuit includes a patterning step of a metal film performed in the following procedures (a) to (e):
 (a) forming the metal film on the substrate;
 (b) forming a first resist pattern on the metal film by a photolithographic method;
 (c) etching the metal film with the first resist pattern to form a first metal pattern;
 (d) forming by the photolithographic method on the metal film formed in the first metal pattern, a second resist pattern including a pattern shape smaller than a pattern shape of the first resist pattern; and
 (e) etching the metal film with the second resist pattern to form a second metal pattern, and
 the patterning step is applied to forming of a metal layer including a source signal line in the display device.

4. A method for manufacturing a display device comprising a pixel circuit formed on a substrate,
 wherein a manufacturing process of the pixel circuit includes a patterning step of a metal film performed in the following procedures (a) to (e):
 (a) forming the metal film on the substrate;
 (b) forming a first resist pattern on the metal film by a photolithographic method;
 (c) etching the metal film with the first resist pattern to form a first metal pattern;
 (d) forming by the photolithographic method on the metal film formed in the first metal pattern, a second resist pattern including a pattern shape smaller than a pattern shape of the first resist pattern; and
 (e) etching the metal film with the second resist pattern to form a second metal pattern,
 the first resist pattern and the second resist pattern include the same pattern, and
 the first resist pattern is formed to include a line width larger in a wiring line pattern than that of the second resist pattern, in the step (b) and the step (d), the first resist pattern and the second resist pattern are formed by using the same photomask, and an exposure amount in step (b) is less than an exposure amount in step (d).

\* \* \* \* \*